(12) United States Patent
Frougier et al.

(10) Patent No.: US 10,679,894 B2
(45) Date of Patent: Jun. 9, 2020

(54) AIRGAP SPACERS FORMED IN CONJUNCTION WITH A LATE GATE CUT

(71) Applicant: GLOBALFOUNDRIES Inc., Grand Cayman (KY)

(72) Inventors: Julien Frougier, Albany, NY (US); Ruilong Xie, Niskayuna, NY (US); Chanro Park, Clifton Park, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 36 days.

(21) Appl. No.: 16/185,799

(22) Filed: Nov. 9, 2018

(65) Prior Publication Data
US 2020/0152504 A1    May 14, 2020

(51) Int. Cl.
| H01L 21/768 | (2006.01) |
| H01L 27/088 | (2006.01) |
| H01L 29/49 | (2006.01) |
| H01L 29/66 | (2006.01) |

(52) U.S. Cl.
CPC ...... *H01L 21/7682* (2013.01); *H01L 29/4991* (2013.01); *H01L 29/6653* (2013.01); *H01L 29/66795* (2013.01)

(58) Field of Classification Search
USPC .......................................... 257/386; 438/299
See application file for complete search history.

(56) References Cited

U.S. PATENT DOCUMENTS

| 9,324,713 | B1 | 4/2016 | Yu et al. |
| 9,373,618 | B1 | 6/2016 | Basker et al. |
| 9,515,156 | B2 | 12/2016 | Besser et al. |
| 9,818,876 | B1 | 11/2017 | Bouche |
| 9,825,031 | B1 * | 11/2017 | Bouche ............ H01L 21/76897 |
| 2015/0214330 | A1 * | 7/2015 | Wan .................. H01L 29/66545 |
| | | | 438/595 |
| 2016/0284817 | A1 * | 9/2016 | Basker .................. H01L 23/485 |

* cited by examiner

*Primary Examiner* — Long K Tran
(74) *Attorney, Agent, or Firm* — Thompson Hine LLP (57) ABSTRACT

Methods of forming a field-effect transistor and structures for a field effect-transistor. A sidewall spacer is formed adjacent to a sidewall of a gate structure of the field-effect transistor and a dielectric cap is formed over the gate structure and the sidewall spacer. A cut is formed that extends through the dielectric cap, the gate structure, and the sidewall spacer. After forming the cut, the sidewall spacer is removed from beneath the dielectric cap to define a cavity, and a dielectric material is deposited in the cut and in the cavity. The dielectric material encapsulates a portion of the cavity to define an airgap spacer.

20 Claims, 11 Drawing Sheets

AIRGAP SPACERS FORMED IN CONJUNCTION WITH A LATE GATE CUT

BACKGROUND

The present invention relates to semiconductor device fabrication and integrated circuits and, more specifically, to methods of forming a field-effect transistor and structures for a field effect-transistor.

Complementary-metal-oxide-semiconductor (CMOS) processes may be used to build a combination of p-type and n-type field-effect transistors that are used to construct, for example, logic cells. Field-effect transistors generally include a body defining a channel region, a source, a drain, and a gate electrode. When a control voltage exceeding a characteristic threshold voltage is applied to the gate electrode, carrier flow occurs in the channel region between the source and drain to produce a device output current.

The gate electrode may be covered by a self-aligned contact cap that protects the gate electrode during the formation of source/drain contacts. Sidewall spacers are arranged adjacent to the sidewalls of the gate electrode. The sidewall spacers may be composed of a dielectric material having a low dielectric constant. In that regard, the sidewall spacers may incorporate airgaps to form airgap spacers. In conventional process flows, the airgap spacers are formed after forming the source/drain contacts and after removing the self-aligned contact caps from their positions over the gate electrodes. Specifically, the self-aligned contact caps and sacrificial sidewall spacers are removed to generate opened spaces, and the opened spaces are refilled with portions of a dielectric layer that is non-conformally deposited. The deposited dielectric layer pinches off in the narrow portions of the spaces formerly occupied by the sidewall spacers and thereby forms the airgap spacers. The deposited dielectric layer also re-forms the self-aligned contact caps over the gate electrodes. The locations of the airgap spacers are based on the profiles of the gate electrodes and source/drain contacts, which may introduce significant variations in the locations of the airgaps and elevate the risk that the airgaps may be opened and filled with metal during downstream processing steps.

Improved structures for a field-effect transistor and methods of forming a structure for a field-effect transistor are needed.

SUMMARY

In an embodiment of the invention, a method includes forming a gate structure, forming a sidewall spacer adjacent to a sidewall of the gate structure, forming a dielectric cap over the gate structure and the sidewall spacer, and forming a cut extending through the dielectric cap, the gate structure, and the sidewall spacer. After forming the cut, the sidewall spacer is removed from beneath the dielectric cap to define a cavity, and a dielectric material is deposited in the cut and in the cavity. The dielectric material encapsulates a portion of the cavity to define an airgap spacer.

In an embodiment of the invention, a structure includes a gate structure with a first lengthwise section and a second lengthwise section, and an airgap spacer adjacent to a sidewall of the first lengthwise section of the gate structure. The airgap spacer includes a first portion of a dielectric material and a cavity encapsulated within the first portion of the dielectric material. A dielectric pillar is arranged in a cut between the first lengthwise section of the gate structure and the second lengthwise section of the gate structure. The dielectric pillar includes a second portion of the dielectric material that is contiguous with the first portion of the dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

With reference to FIGS. 1 and 1A-1C and in accordance with embodiments of the invention, fins 10, 12 of an integrated circuit structure are formed that project from a substrate 14. The fins 10, 12 may be formed by patterning the single-crystal semiconductor material (e.g., single-crystal silicon) of the substrate 14 with lithography and etching processes, and cutting the patterning semiconductor material into given lengths in the layout associated with the specific device structures being formed and their arrangement. Trench isolation regions 16 are formed that operate to electrically isolate the fins 10, 12 from each other. The trench isolation regions 16 may be formed by depositing a layer composed of a dielectric material, such as an oxide of silicon (e.g., silicon dioxide), by chemical vapor deposition (CVD), and recessing with an etching process. An upper section of each of the fins 10, 12 is revealed by the recessing of the trench isolation regions 16, and a lower section of each of the fins 10, 12 is surrounded by the trench isolation regions 16.

Gate structures 18 of the integrated circuit structure are formed that extend over the fins 10, 12, substrate 14, and trench isolation regions 16. Each gate structure 18 is arranged transverse to the fins 10 and overlaps with a section of each fin 10. Each gate structure 18 is also arranged transverse to the fins 12 and overlaps with a section of each fin 12. Each gate structure 18 may include a gate electrode 20 and a gate dielectric layer 22 arranged between the overlapped sections of the fins 10, 12 and the gate electrode 20. The gate electrode 20 may include one or more conformal barrier metal layers and/or work function metal layers, such as metal layers composed of titanium aluminum carbide and/or titanium nitride, and a metal gate fill layer composed of a conductor, such as tungsten. The gate dielectric layer 22 may be composed of a high-k dielectric material, such as hafnium oxide.

Each of the gate structures 18 includes a sidewall 23 and a sidewall 24 that is opposite from the sidewall 23, as well as a top surface 25 that connects the sidewalls 23, 24. Sidewall spacers 26 are arranged on the opposite sidewalls 23, 24 of the gate structures 18. The sidewall spacers 26 may be composed of a sacrificial material, such as aluminum oxide or titanium oxide, that is deposited with atomic layer deposition (ALD) as a conformal layer on the gate structures 18 and etched with a directional etching process, such as reactive ion etching (RIE). The sidewall spacers 26 are placeholder structures that are subsequently removed to form air gap spacers.

Semiconductor layers 28 are epitaxially grown from the fins 10, 12. The semiconductor layers 28 may be formed by an epitaxial growth process in which semiconductor material nucleates for epitaxial growth from a semiconductor surface, such as the exposed surfaces of fins 10, 12, and grows in crystalline fashion. For example, the epitaxial semiconductor layers 28 may contain silicon-germanium doped during epitaxial growth with a p-type dopant (e.g., boron, aluminum, gallium, and/or indium) that provides p-type electrical conductivity. As another example, the epitaxial semiconductor layers 28 may contain silicon-germanium doped during epitaxial growth with an n-type dopant (e.g., phosphorus and/or arsenic) that provides n-type electrical conductivity. The epitaxial semiconductor layers 28 furnish source/drain regions for field-effect transistors formed using the fins 10, 12 and gate structures 18. As used herein, the term "source/drain region" means a doped region of semiconductor material that can function as either a source or a drain of a field-effect transistor.

A conformal contact etch stop layer (CESL) 32 and an interlayer dielectric layer 34 are formed to fill the spaces over the epitaxial semiconductor layers 28. The CESL 32 provides a liner arranged over the epitaxial semiconductor layers 28 and between the sidewall spacers 26 and the sections of interlayer dielectric layer 34. The CESL 32 may be composed of a thin layer of a dielectric material, such as silicon nitride, deposited by atomic layer deposition. The interlayer dielectric layer 34 may be composed of a dielectric material, such as silicon dioxide, that is deposited by chemical vapor deposition and planarized, and that is different in composition from the dielectric material of the sidewall spacers 26.

Figure 1:
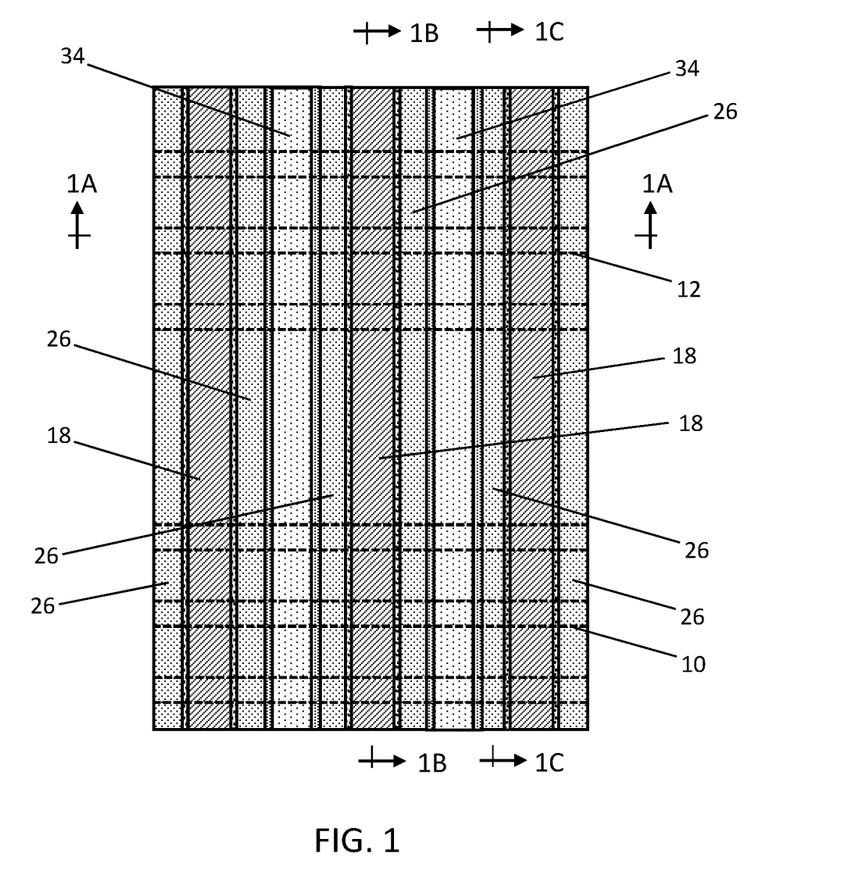
FIG. 1 is a top view of a structure at an initial fabrication stage of a processing method in accordance with embodiments of the invention.
Figure 1A:
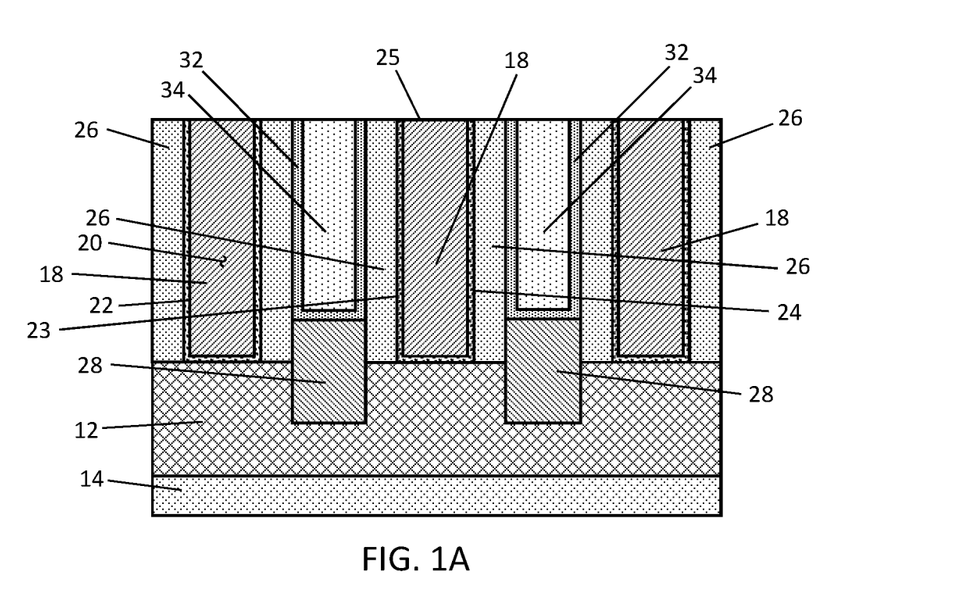
FIG. 1A is a cross-sectional view taken generally along line 1A-1A in FIG. 1.
Figure 1B:
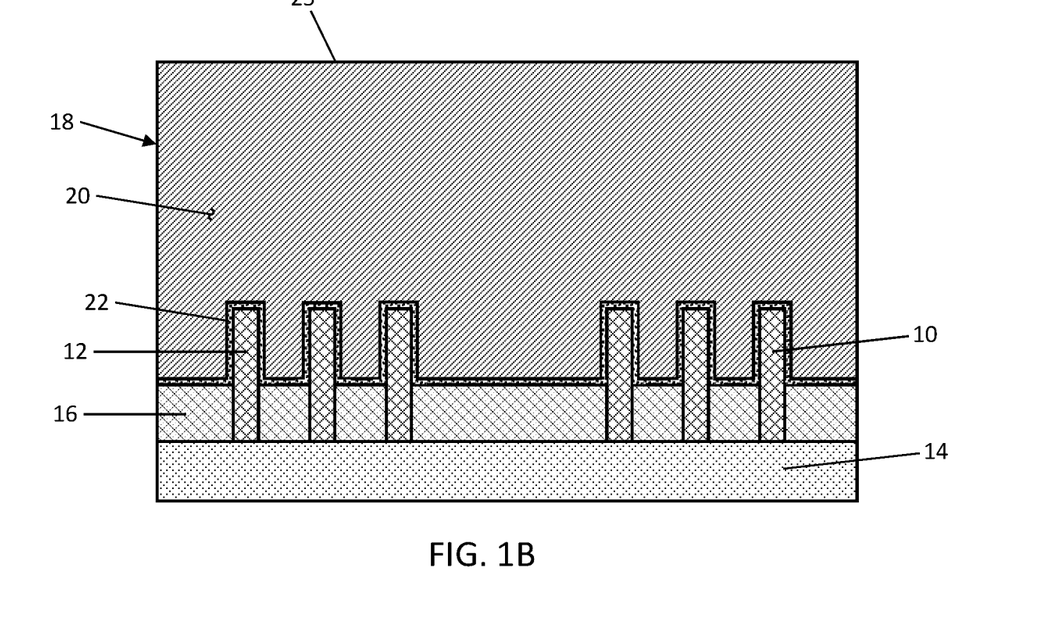
FIG. 1B is a cross-sectional view taken generally along line 1B-1B in FIG. 1.
Figure 1C:
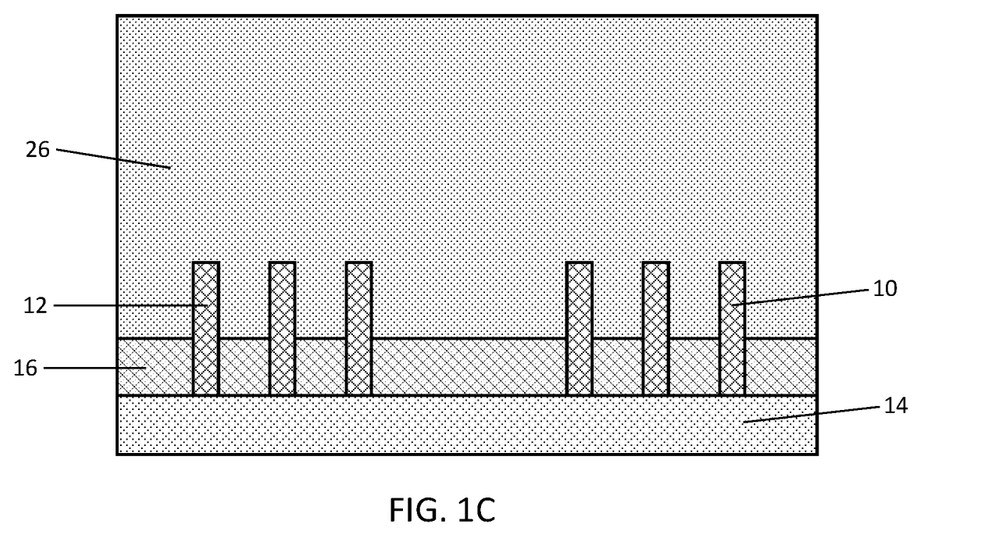
FIG. 1C is a cross-sectional view taken generally along line 1C-1C in FIG. 1.
Figure 2A:
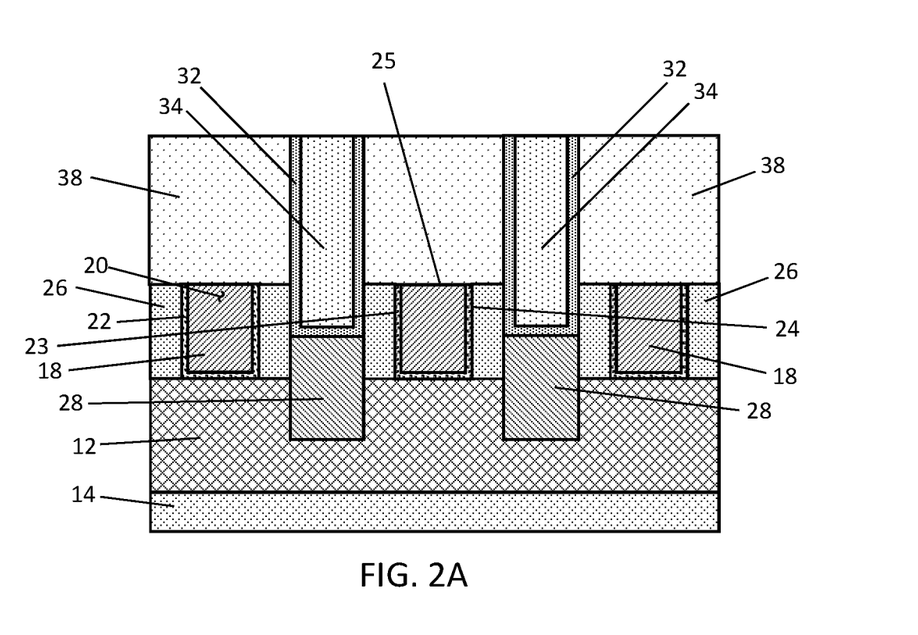
FIGS. 2A-2C are cross-sectional views of the structure at a fabrication stage of the processing method subsequent to FIGS. 1A-1C.
Figure 2B:
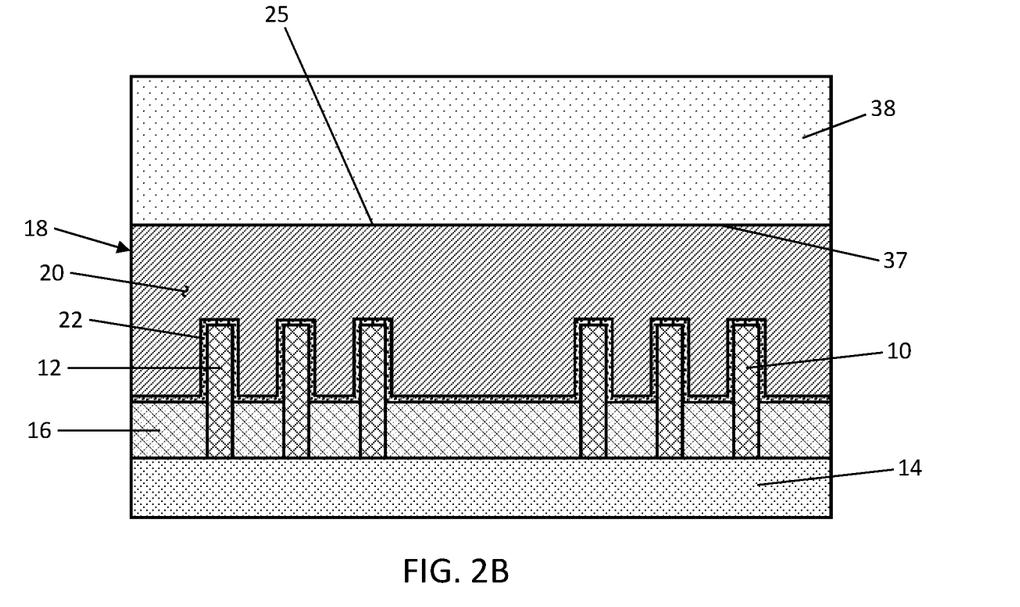
Figure 2C:
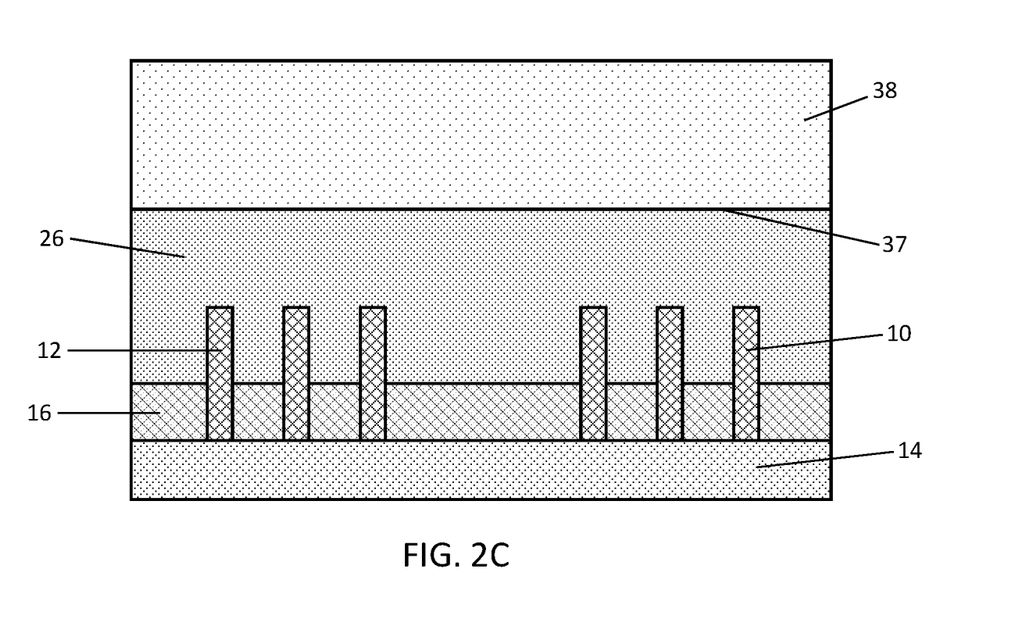

With reference to FIGS. 2A-2C in which like reference numerals refer to like features in FIGS. 1A-1C and at a subsequent fabrication stage of the processing method, the gate electrode 20 and the gate dielectric layer 22 of the gate structures 18 are recessed relative to the sidewall spacers 26, the CESL 32, and the interlayer dielectric layer 34 using one or more selective etching processes to form cavities. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Portions of the sidewall spacers 26 are arranged above the top surface 25 of the recessed gate structures 18.

The portions of the sidewall spacers 26 arranged above the top surface 25 of the recessed gate structures 18 are removed with an etching process that widens the cavities. The etching process may include, for example, a reactive ion etching process that removes the material of the sidewall spacers 26 selective to the materials of the gate structures 18, the CESL 32, and the interlayer dielectric layer 34. The height of the sidewall spacers 26 is effectively shortened by the etching process, and the shortened sidewall spacers 26 may be coplanar with the gate structures 18.

After the sidewall spacers 26 are etched, self-aligned contact caps 38 are formed in the widened cavities over the gate structures 18 and sidewall spacers 26. The self-aligned contact caps 38 may be may be composed of a layer of a dielectric material, such as silicon nitride, that is deposited by chemical vapor deposition to fill the widened cavities over the gate structures 18 and sidewall spacers 26 and then planarized with chemical-mechanical polishing (CMP). Each self-aligned contact cap 38 has a bottom surface 37 that shares a boundary with the top surface 25 of the associated gate structure 18 and the adjacent top surfaces of the sidewall spacers 26.

Figure 3A:
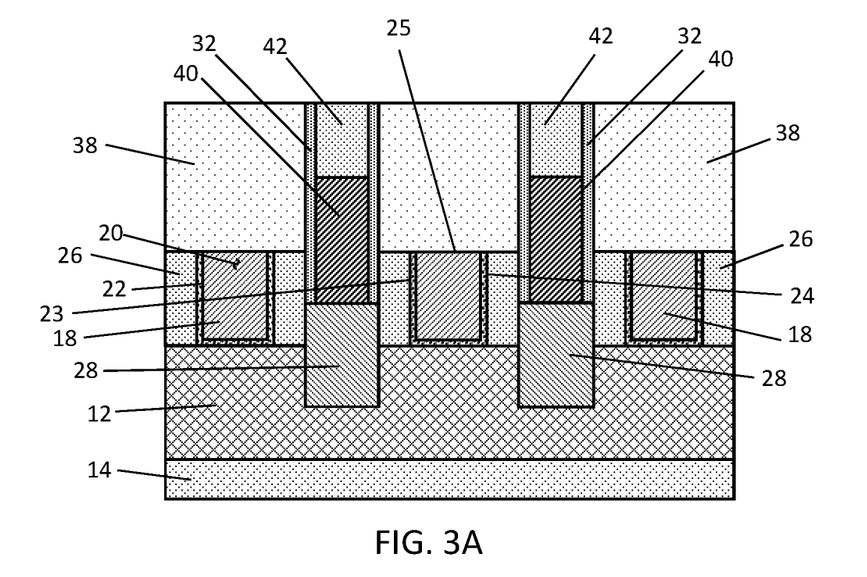
FIGS. 3A-3C are cross-sectional views of the structure at a fabrication stage of the processing method subsequent to FIGS. 2A-2C.
Figure 3B:
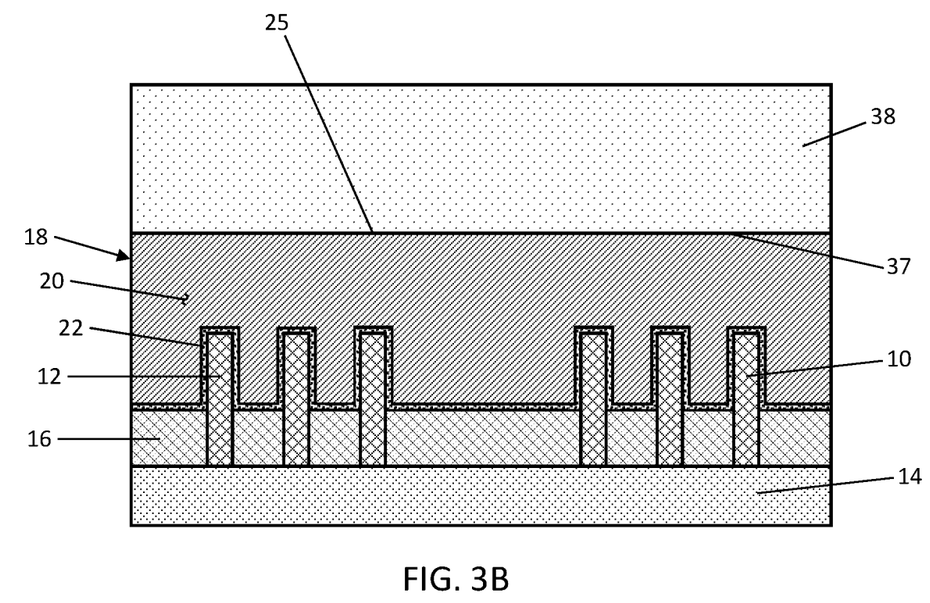
Figure 3C:
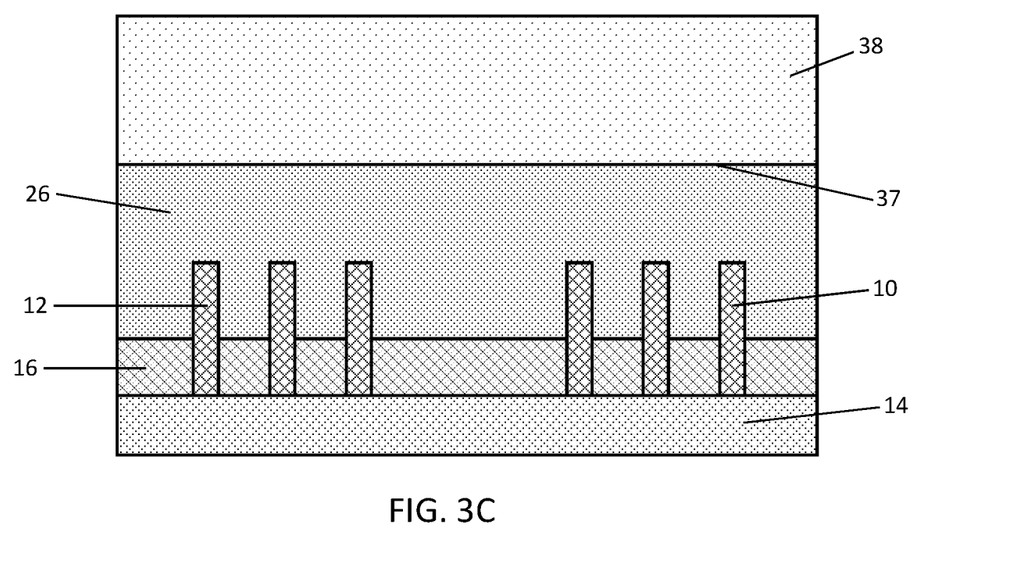

With reference to FIGS. 3A-3C in which like reference numerals refer to like features in FIGS. 2A-2C and at a subsequent fabrication stage of the processing method, the CESL 32 and the interlayer dielectric layer 34 are removed from their respective positions over the epitaxial semiconductor layers 28, which exposes the epitaxial semiconductor layers 28. The cavities opened by removal of the CESL 32 and interlayer dielectric layer 34 are filled with trench silicide (TS) contacts 40. The TS contacts 40 are physically and electrically connected with the epitaxial semiconductor layers 28. The TS contacts 40, which are arranged in a vertical direction over the epitaxial semiconductor layers 28, may include a metal silicide, such as tungsten silicide, titanium silicide, nickel silicide, or cobalt silicide, formed by silicidation. The TS contacts 40 may be deposited by, for example, chemical vapor deposition, planarized by chemical-mechanical polishing, and recessed with a selective etching process.

Dielectric caps 42 are formed in the portion of the cavities over the recessed TS contacts 40. The dielectric caps 42 may be may be composed of a layer of dielectric material, such as silicon nitride, that is deposited to fill the portion of the opened spaces over the recessed TS contacts 40 by chemical vapor deposition and then planarized with chemical-mechanical polishing (CMP).

Figure 4A:
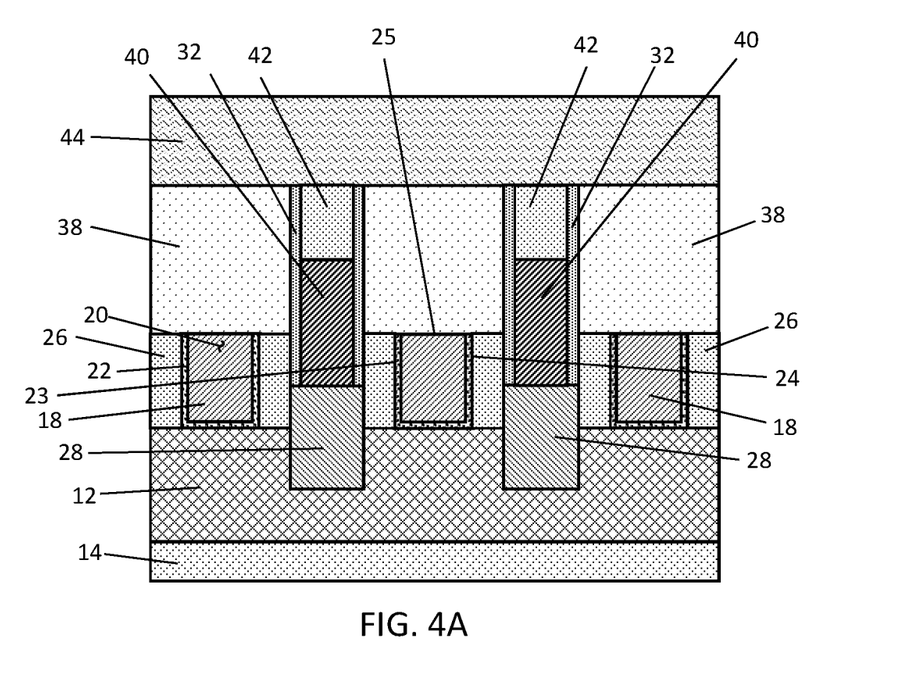
FIGS. 4A-4C are cross-sectional views of the structure at a fabrication stage of the processing method subsequent to FIGS. 3A-3C.
Figure 4B:
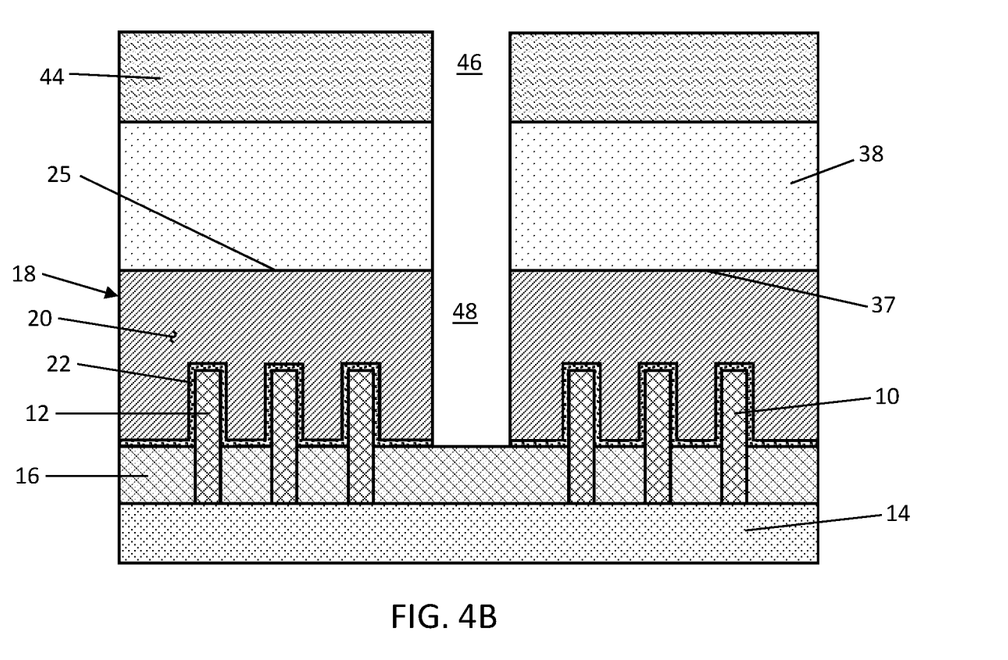
Figure 4C:
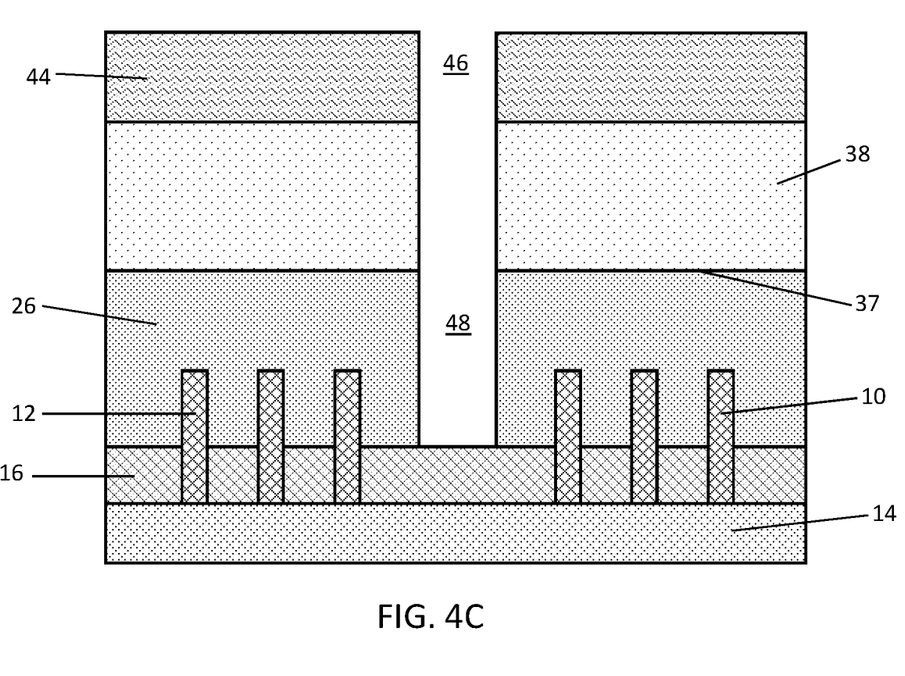

With reference to FIGS. 4A-4C in which like reference numerals refer to like features in FIGS. 3A-3C and at a subsequent fabrication stage of the processing method, an etch mask 44 is formed by applying a lithography stack and patterning the lithography stack to generate an opening 46. The etch mask 44 may include a photoresist layer, an organic planarization layer (OPL) material, and an anti-reflection coating that are patterned with lithography and etching processes. The opening 46 in the etch mask 44 exposes portions of the self-aligned contact caps 38 over the gate structures 18 over an area arranged in a lateral direction between the fins 10 and the fins 12. The opening 46 extends transverse to the length of the gate structures 18.

The portions of the self-aligned contact caps 38 exposed by the opening 46 in the etch mask 44 are etched and removed with an etching process, such as a reactive ion etching process, to expose portions of the gate electrode 20 and the gate dielectric layer 22 of the gate structures 18 and the sidewall spacers 26. The exposed portions of the gate electrode 20 and the gate dielectric layer 22 of the gate structures 18 and the sidewall spacers 26 are then etched and removed with one or more anisotropic etching processes, such as reactive ion etching processes, to expose portions of the trench isolation regions 16. Each gate structure 18 and its sidewall spacers 26 are divided by the one or more etching processes into distinct disconnected lengthwise sections separated by a cut 48. One of the lengthwise sections of each gate structure 18 is associated with the fins 10, and the other of the lengthwise sections of each gate structure 18 is associated with the fins 12. The etch mask 44 may be removed after forming the cut 48.

Figure 5A:
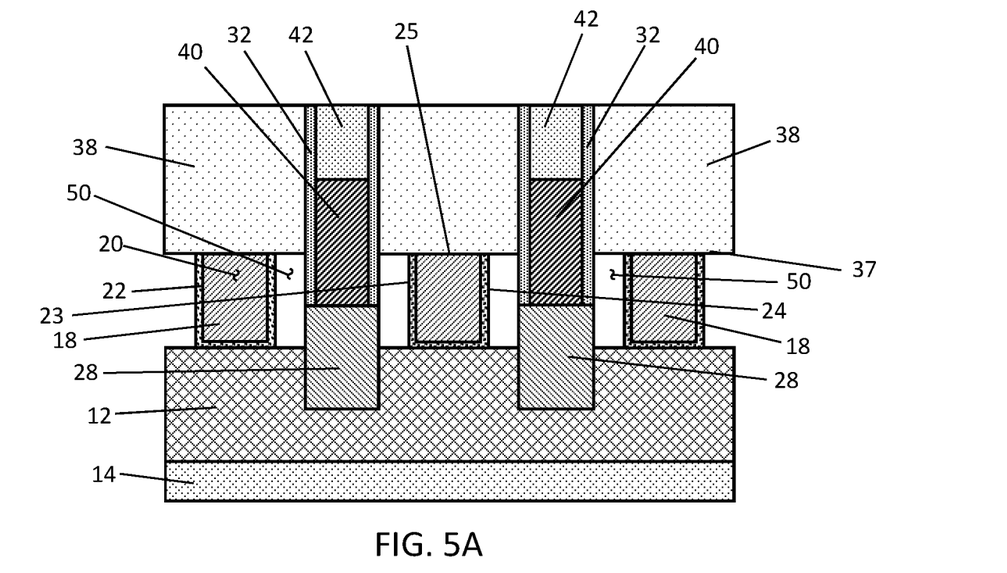
FIGS. 5A-5C are cross-sectional views of the structure at a fabrication stage of the processing method subsequent to FIGS. 4A-4C.
Figure 5B:
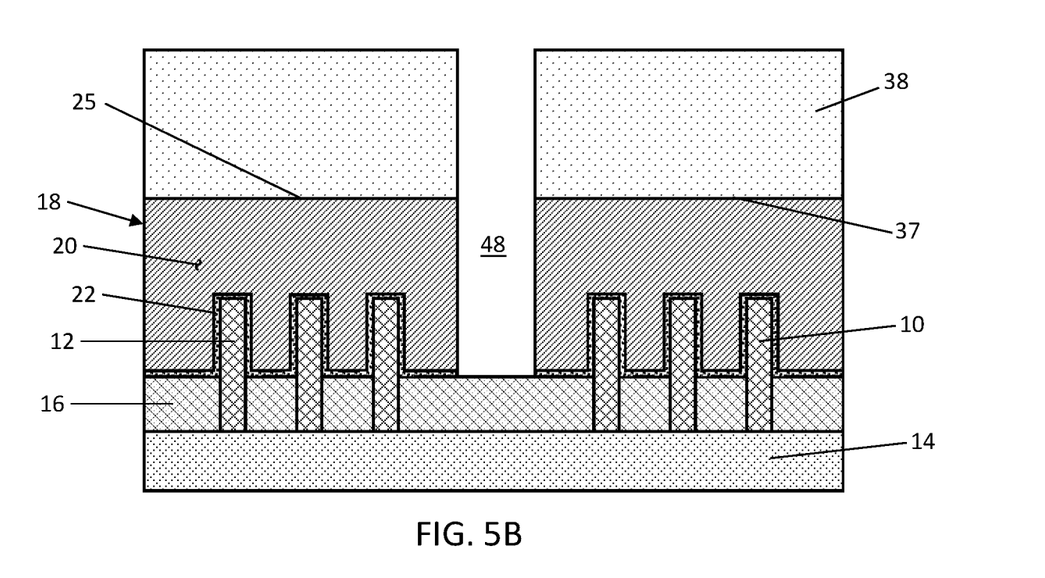
Figure 5C:
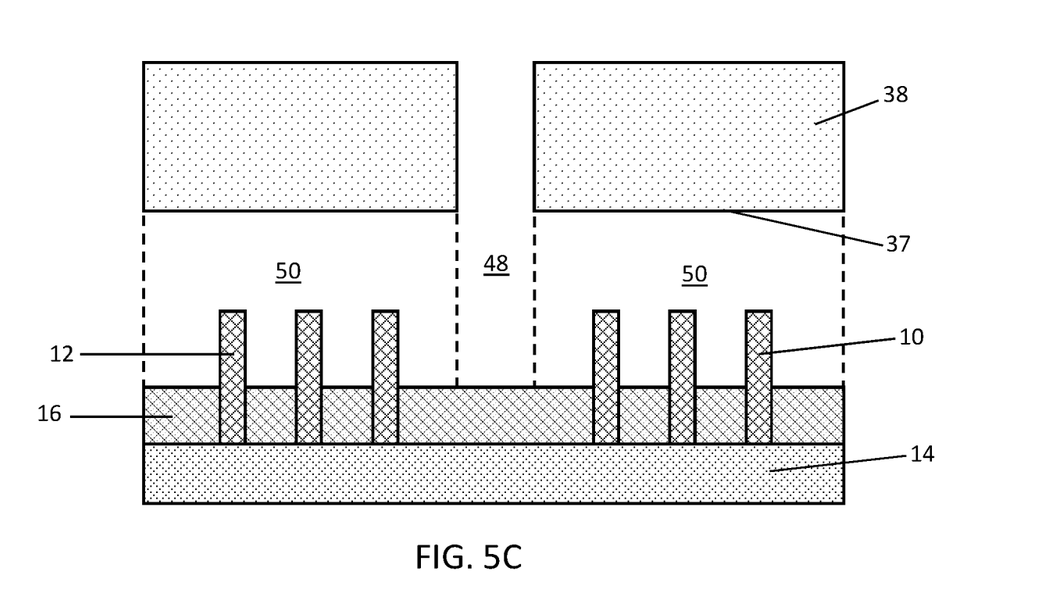

With reference to FIGS. 5A-5C in which like reference numerals refer to like features in FIGS. 4A-4C and at a subsequent fabrication stage of the processing method, the sidewall spacers 26 are etched and removed by an etching process, such as a wet chemical etching process, that is isotropic with lateral and vertical components. Access for the ingress of the etching process is provided through the cut 48, and the sidewall spacers 26 may be fully removed by the etching process. The lateral removal of the sidewall spacers 26 forms cavities 50 that are arranged beneath the self-aligned contact caps 38 and, in particular, below the bottom surfaces 37 of the self-aligned contact caps 38. The etching process removes the sidewall spacers 26 selective to the self-aligned contact caps 38 such that the self-aligned contact caps 38 are undercut to form the cavities 50. The etching process also removes the sidewall spacers 26 selective to the fins 10, 12, the trench isolation regions 16, the gate structures 18, the epitaxial semiconductor layers 28, and the TS contacts 40. The materials of the involved features are selected to provide the etch selectivity.

The cavities 50 are arranged in the spaces formerly occupied by the sidewall spacers 26, and each cavity 50 may have dimensions equal or substantially equal to the dimensions of the removed sidewall spacer 26. Each cavity 50 defines a covered channel or passageway extending laterally beneath the bottom surface of the overlying self-aligned contact cap 38. In particular, a portion of each cavity 50 extends laterally from the cut 48 toward and over the fins 10, and another portion of each cavity 50 also extends laterally in an opposite direction from the cut 48 toward and over the fins 12. The cavities 50 are aligned parallel or substantially parallel to the length of the gate structures 18 and are self-aligned during the lateral etching process by the physical presence of the gate structures 18, TS contacts 40, and self-aligned contact caps 38.

The overlying self-aligned contact caps 38 and the underlying trench isolation regions 16 and fins 10, 12 provide vertical constraint during the etching process such that the height of the cavities 50 is uniform among the different cavities 50. Each cavity 50 extends in a vertical direction from the trench isolation regions 16 to the bordering bottom surface 37 of the self-aligned contact caps 38. The gate structures 18 and the stacked epitaxial semiconductor layers 28 and TS contacts 40 provide horizontal constraint during the etching process. The cavities 50 are formed without removing the self-aligned contact caps 38 as is done when performing conventional processes in order to remove the sidewall spacers. The dimensions (e.g., length, width, and height) of the cavities 50 may be equal or substantially equal to the dimensions of the removed sidewall spacers 26.

Figure 6A:
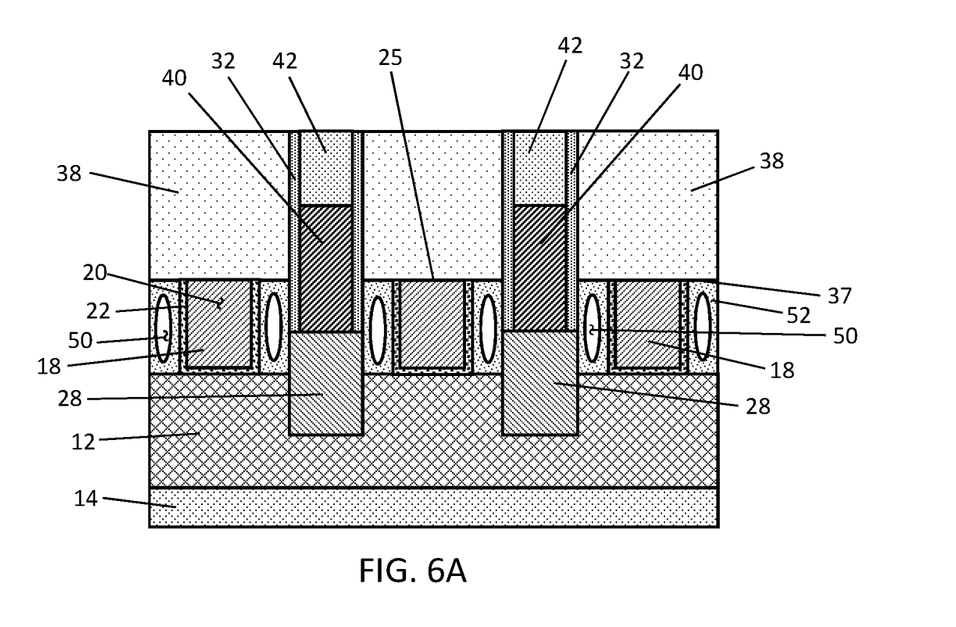
FIGS. 6A-6C are cross-sectional views of the structure at a fabrication stage of the processing method subsequent to FIGS. 5A-5C.
Figure 6B:
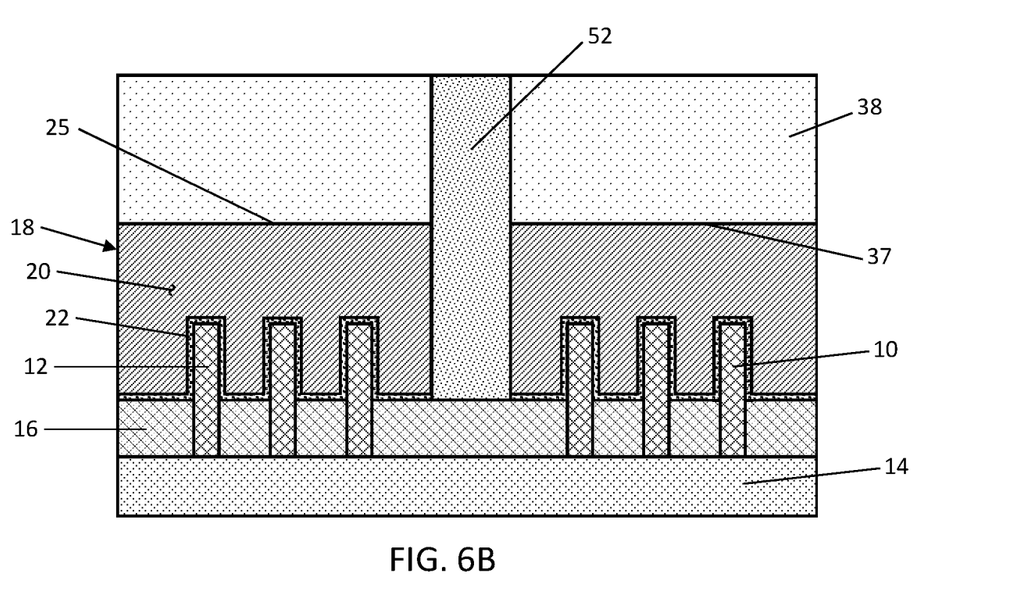
Figure 6C:
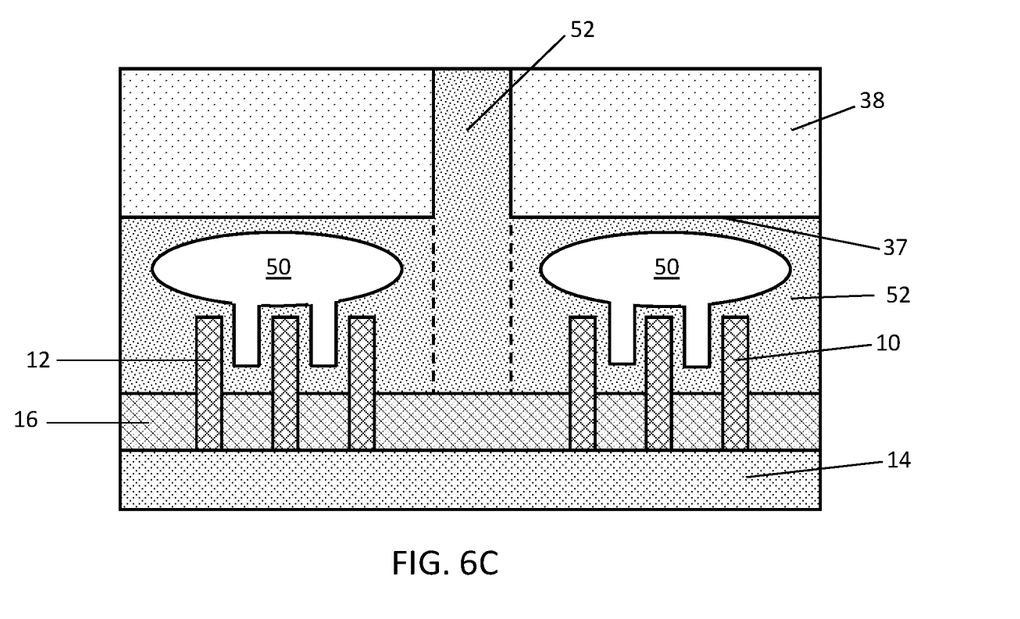

With reference to FIGS. 6A-6C in which like reference numerals refer to like features in FIGS. 5A-5C and at a subsequent fabrication stage of the processing method, a dielectric layer 52 is concurrently deposited in the cut 48 and inside the cavities 50. The dielectric layer 52 may be composed of silicon dioxide or a low-k dielectric material, such as SiC, SiOC, SiOCN, SiN, or SiBCN, deposited by atomic layer deposition or chemical vapor deposition.

The dielectric layer 52 deposits on the surfaces inside the cavities 50 and within the cut 48, and pinches-off to prevent complete filling of the cavities 50. Instead, portions of the cavities 50 remain unfilled and are surrounded by the dielectric material of the dielectric layer 52. The portions of the cavities 50 are sealed in part by the portion of the dielectric material deposited inside the cut 48 and are encapsulated by the dielectric material of the dielectric layer 52. The sealed portions of the cavities 50 define one or more airgaps that may be characterized by a permittivity or dielectric constant of near unity (i.e., vacuum permittivity). Each airgap may be filled by atmospheric air at or near atmospheric pressure, may be filled by another gas at or near atmospheric pressure, or may contain atmospheric air or another gas at a sub-atmospheric pressure (e.g., a partial vacuum). The sealed portions of the cavities 50 are arranged over and between the fins 10, 12, and generally between the bottom surface 37 of the self-aligned contact caps 38 and the trench isolation regions 16. The combination of the cavities 50 and the dielectric material of the dielectric layer 52 defines airgap spacers that are arranged with precise placement between the gate structures 18 and the TS contacts 40. The composite dielectric constant of the airgap spacers is less than the dielectric constant of the dielectric material of the dielectric layer 52.

The portion of the dielectric material deposited inside the cut 48 provides a dielectric pillar furnishing electrical isolation between the lengthwise sections of the gate structures 18 associated with fins 10 and the lengthwise sections of the gate structures 18 associated with fins 12. The portion of the dielectric material deposited inside the cut 48 is contiguous with the portions of the dielectric material deposited inside the cavities 50 that participate in forming the airgap spacers.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a gate structure having a sidewall;
   forming a sidewall spacer adjacent to the sidewall of the gate structure;
   forming a self-aligned contact cap over the gate structure and the sidewall spacer;
   forming a cut extending through the self-aligned contact cap, the gate structure, and the sidewall spacer;
   after forming the cut, removing the sidewall spacer from beneath the self-aligned contact cap to define a cavity; and
   depositing a first dielectric material in the cut and in the cavity,
   wherein the first dielectric material encapsulates a portion of the cavity to define an airgap spacer.

2. The method of claim 1 wherein the gate structure overlaps with a first plurality of fins, the cavity extends from the cut parallel to the sidewall of the gate structure, and the cavity is arranged over and between the first plurality of fins.

3. The method of claim 2 wherein the gate structure further overlaps with a second plurality of fins, the cut is arranged between the first plurality of fins and the second plurality of fins, and the cavity is arranged over and between the second plurality of fins.

4. The method of claim 2 wherein a plurality of trench isolation regions surround respective bottom sections of the first plurality of fins, and the cavity extends in a vertical direction from the plurality of trench isolation regions to a bottom surface of the self-aligned contact cap.

5. The method of claim 1 further comprising:
   forming an epitaxial semiconductor layer adjacent to the sidewall spacer; and
   forming a contact connected with the epitaxial semiconductor layer,
   wherein the cavity is arranged between the gate structure and the contact.

6. The method of claim 5 wherein the contact is formed before removing the sidewall spacer.

7. The method of claim 5 wherein the cavity extends from the sidewall of the gate structure to the contact.

8. The method of claim 1 wherein forming the dielectric self-aligned contact cap over the gate structure and the sidewall spacer comprises:
   recessing the gate structure;
   after recessing the gate structure, recessing the sidewall spacer; and
   after recessing the gate structure, depositing a second dielectric material over the gate structure and the sidewall spacer to form the self-aligned contact cap.

9. The method of claim 1 wherein forming the cut extending through the self-aligned contact cap, the gate structure, and the sidewall spacer comprises:
   applying an etch mask with an opening over respective portions of self-aligned contact cap, the gate structure, and the sidewall spacer; and
   etching the portions of the self-aligned contact cap, the gate structure, and the sidewall spacer through the opening in the etch mask.

10. The method of claim 1 wherein the sidewall spacer is removed from beneath the self-aligned contact cap by an isotropic etching process.

11. The method of claim 1 wherein removing the sidewall spacer from beneath the self-aligned contact cap to define the cavity comprises:
    laterally recessing the sidewall spacer outward from the cut beneath the self-aligned contact cap.

12. The method of claim 11 wherein the sidewall spacer is laterally recessed by an isotropic etching process.

13. The method of claim 1 wherein the cut is arranged transverse to the sidewall spacer and to the gate structure.

14. The method of claim 1 wherein the sidewall spacer is fully removed from beneath the self-aligned contact cap.

15. The method of claim 1 wherein the first dielectric material is deposited in the cut and in the cavity by a single deposition process.

16. The method of claim 1 wherein the sidewall spacer is comprised of aluminum oxide or titanium oxide, and the self-aligned contact cap is comprised of silicon nitride.

17. The method of claim 1 wherein the sidewall spacer is comprised of titanium oxide, and the self-aligned contact cap is comprised of silicon nitride.

18. The method of claim 1 wherein the dielectric material pinches off inside the cavity to encapsulate the portion of the cavity and define the airgap spacer.

19. The method of claim 1 wherein the first dielectric material in the cut closes the portion of the cavity to define the airgap spacer.

20. A structure comprising:
    a gate structure including a first section and a second section separated from the first section by a cut;
    a self-aligned contact cap over the gate structure;
    an airgap spacer adjacent to a sidewall of the first section of the gate structure and below the self-aligned contact cap, the airgap spacer including a first portion of a dielectric material and a cavity encapsulated within the first portion of the dielectric material; and
    a dielectric pillar arranged in the cut between the first section of the gate structure and the second section of the gate structure, the dielectric pillar comprised of a second portion of the dielectric material that is contiguous with the first portion of the dielectric material.

* * * * *